United States Patent [19]
Arldt et al.

[11] Patent Number: 5,766,670
[45] Date of Patent: Jun. 16, 1998

[54] VIA FILL COMPOSITIONS FOR DIRECT ATTACH OF DEVICES AND METHODS FOR APPLYING SAME

[76] Inventors: Roy Lynn Arldt, P.O. Box 381, Georgetown, Tex. 78627; Christina Marie Boyko, Box 394 Conklin Rd., Conklin, N.Y. 13748; Burtran Joe Cayson, 12805 Covington Trail, Austin, Tex. 78727; Richard Michael Kozlowski, 5 Van Riper Rd., Apalachin, N.Y. 13732; Joseph Duane Kulesza, 4252 Renole Dr., Binghamton, N.Y. 13903; John Matthew Lauffer, 213 Lincoln St. Extension, Waverly, N.Y. 14892; Philip Chihchau Liu, 1158 Talan Dr., Endwell, N.Y. 13760; Voya Rista Markovich, 3611 Joel Dr., Endwell, N.Y. 13760; Issa Said Mahmoud, 75 Glan Rd., Apalachin, N.Y. 13732; James Francis Muska, 106 North St., Johnson City, N.Y. 13790; Kostas Papathomas, 75 Coventry Rd., Endicott, N.Y. 13760; Joseph Gene Sabia, 8 Sheldon St., Norwich, N.Y. 13815; Richard Anthony Schumacher, 53 Coventry Rd., Endicott, N.Y. 13760

[21] Appl. No.: 154,341

[22] Filed: Nov. 17, 1993

[51] Int. Cl.⁶ ...................................................... B05D 5/12
[52] U.S. Cl. .............................. 427/8; 427/97; 427/101; 29/846
[58] Field of Search ............................... 427/101, 97, 10, 427/96, 8; 228/180.22; 29/840, 846

[56] References Cited

U.S. PATENT DOCUMENTS

| | | | |
|---|---|---|---|
| 3,546,015 | 12/1970 | Vulliez | 427/10 |
| 3,601,523 | 8/1971 | Arndt et al. | 174/264 |
| 4,008,300 | 2/1977 | Ponn | 264/104 |
| 4,179,797 | 12/1979 | Johnson | 29/613 |
| 4,278,706 | 7/1981 | Barry | 427/101 |
| 4,383,363 | 5/1983 | Hayakawa et al. | 29/847 |
| 4,415,607 | 11/1983 | Denes et al. | 427/96 |
| 4,442,966 | 4/1984 | Jourdain et al. | 228/123 |
| 5,006,673 | 4/1991 | Freyman et al. | 174/260 |
| 5,047,368 | 9/1991 | Schnitker | 429/96 |
| 5,098,771 | 3/1992 | Friend | 427/96 |
| 5,133,120 | 7/1992 | Kawakami et al. | 29/852 |

FOREIGN PATENT DOCUMENTS 62-132353  6/1987  Japan.

OTHER PUBLICATIONS

IBM Technical Disclosure Buleetin, vol. 30, No. 7, p. 135, Dec. 1987.

*Primary Examiner*—Katherine Bareford
*Attorney, Agent, or Firm*—Calfee, Halter & Griswold LLP

[57] ABSTRACT

The present invention permits solder joints to be made directly to via and through holes without the solder being wicked into the vias or through holes, by filling plated through holes with an epoxy or cyanate fill composition. When cured and overplated, the fill composition provides support for the solder joint and provides a flat solderable surface for the inter-connection. In certain embodiments, the cured fill compositions, offer a further advantage of being conductive. The invention also relates to several novel methods for filling through holes with such fill compositions, and to resistors located in through holes and vias.

3 Claims, 3 Drawing Sheets

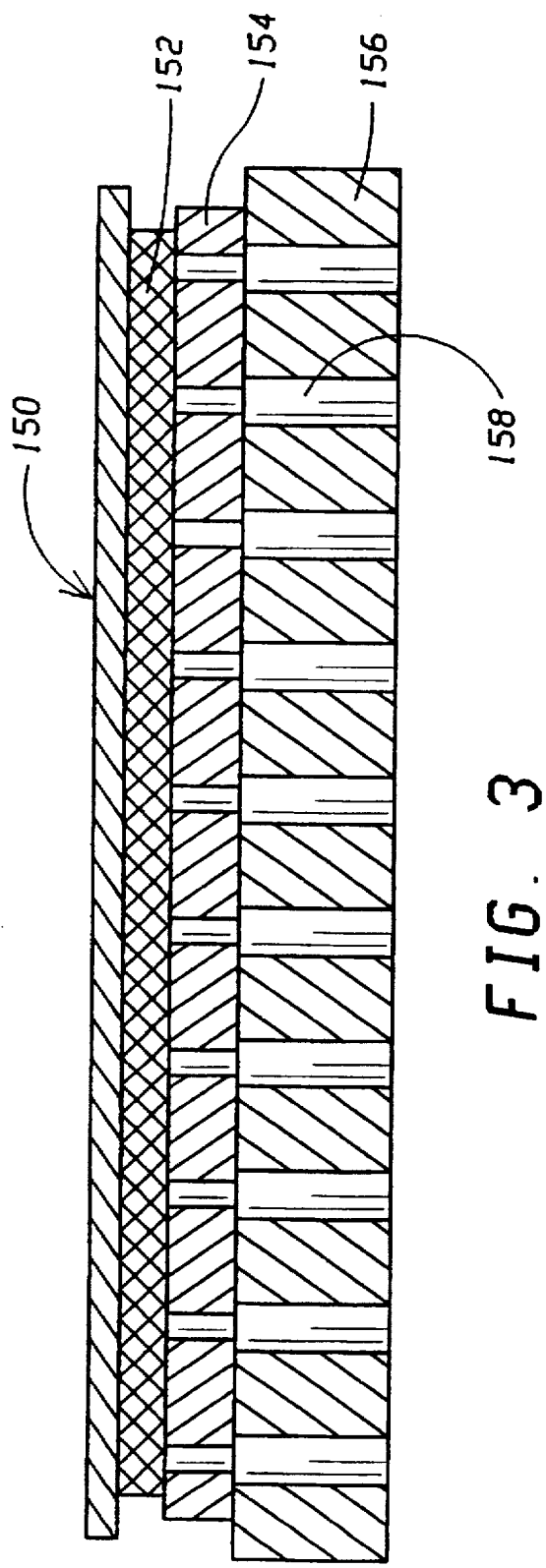
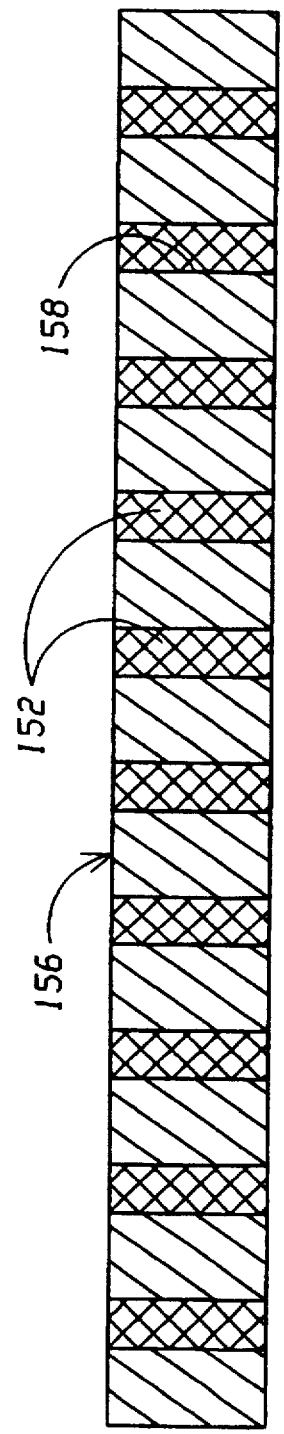
FIG. 3
FIG. 4

VIA FILL COMPOSITIONS FOR DIRECT ATTACH OF DEVICES AND METHODS FOR APPLYING SAME

BACKGROUND OF THE INVENTION

In circuit board construction, solder ball connection of a module, such as a ceramic module, provides significant electrical performance advantage over conventional pin-in-hole technology. Pin-in-hole technology involves the attachment of modules to circuit boards using projections or pins which insert into corresponding holes in the board.

Pin-in-hole connections, due to mechanical considerations, occupy considerable surface area of the circuit board thwarting further miniaturization. In contrast, solder ball technology attaches modules to the board using balls of solder on the module which are joined to corresponding contact points on the surface of the board.

Specifically, a high melting point solder ball is placed on the backside of a module and attached to the module with a low melting point solder paste reflow process. The module is then attached to the surface of the circuit board with a screened, low melting point solder paste. Since attachment of the module to the board is made only on the surface of the board, the attachment land, drill diameter, and clearance land sizes may be reduced in size, thus allowing greater wiring area. Solder ball connection provides the advantage of enhanced system speed because the signal net length is reduced and also provides the advantage of enhanced wiring capability due to reduced via and land diameters.

However, a problem with solder ball connect technology occurs where the solder ball connection is being made to a conventional through hole or via. When such a connection has been attempted, the screened eutectic paste used to connect the solder ball to the board flows through the hole away from the intended inter-connection site during the reflowing process. This results in poor and unreliable solder joints. One attempt to attach a module directly to a via in pad type of land was to pre-fill the through holes with solder to create a solid land prior to attachment of the solder ball. However, the solder is pulled down through the hole, away from the interconnection during the assembly of the circuit board. This pulling down or "wicking" of the solder results in a void below the ball which leads to cracking and thus produces poor, unreliable solder joints.

Another solution to the problem of connecting solder balls to through holes has been to utilize a "dog-bone" type termination where a solid copper land is displaced from the plated through hole or via. The solder joint is made to the solid copper land which is then connected by a circuit line to the via or through hole. While the dog bone termination provides excellent solder joints, it decreases the advantages otherwise obtained with the via in pad solder ball connection technology because the wireability is reduced and the signal line length is increased. Concomitantly, the circuit line occupies space or "real estate" on the surface of the circuit board.

Attempts have also been made to fill vias and through holes with certain polymer materials, but such polymer materials incompletely fill the vias thereby creating significant voids. Such polymer materials also require lengthy processing time due to drying of the solvent. These polymer materials also tend to shrink as the solvent is released, thus causing non-planar surfaces and additional voids. A still further drawback with such materials is limited solderability.

It would be desirable to have solder ball connections directly at through holes thereby consuming less real estate, decreasing signal line length and increasing wireability, and yet exhibiting satisfactory solder joints.

SUMMARY OF THE INVENTION

The present invention permits solder joints to be made directly to vias and through holes without the solder being wicked into the vias or through holes, by filling plated through holes with an epoxy or cyanate fill composition. When cured and overplated, the fill composition provides support for the solder ball and provides a flat solderable surface for the inter-connection. The cured fill compositions offer a further advantage of being electrically conductive. The invention also relates to several novel methods for filling apertures such as through holes with such fill compositions, and to resistors located in such apertures.

BRIEF DESCRIPTION OF THE DRAWINGS

FIG. 3 is a cross sectional, not to scale view showing the sacrificial carrier coated with fill composition and applied to a substrate.

FIG. 4 is a cross sectional, not to scale view showing a substrate with apertures filled by the sacrificial carrier method.

DETAILED DESCRIPTION OF THE INVENTION

The present invention permits solder joints to be made directly to vias and to through holes without the solder being wicked into the through holes, by filling both plated or unplated through holes and vias with an epoxy or cyanate fill composition. When cured and overplated, the fill composition provides support for the solder ball and provides a flat solderable surface for the inter-connection eliminating the path for the solder to pull away from the solder joint. The presence of electrically conductive powder such as copper in the fill composition offers a further advantage of being electrically conductive, thermally stable and solderable. The invention also relates to several novel methods for filling through holes and vias in substrates, such as circuit carriers with such fill compositions. Circuit carriers include, for example, circuit boards, cards, ceramic substrates, organic or inorganic multi-chip modules, organic or inorganic single chip modules.

Figure 1:
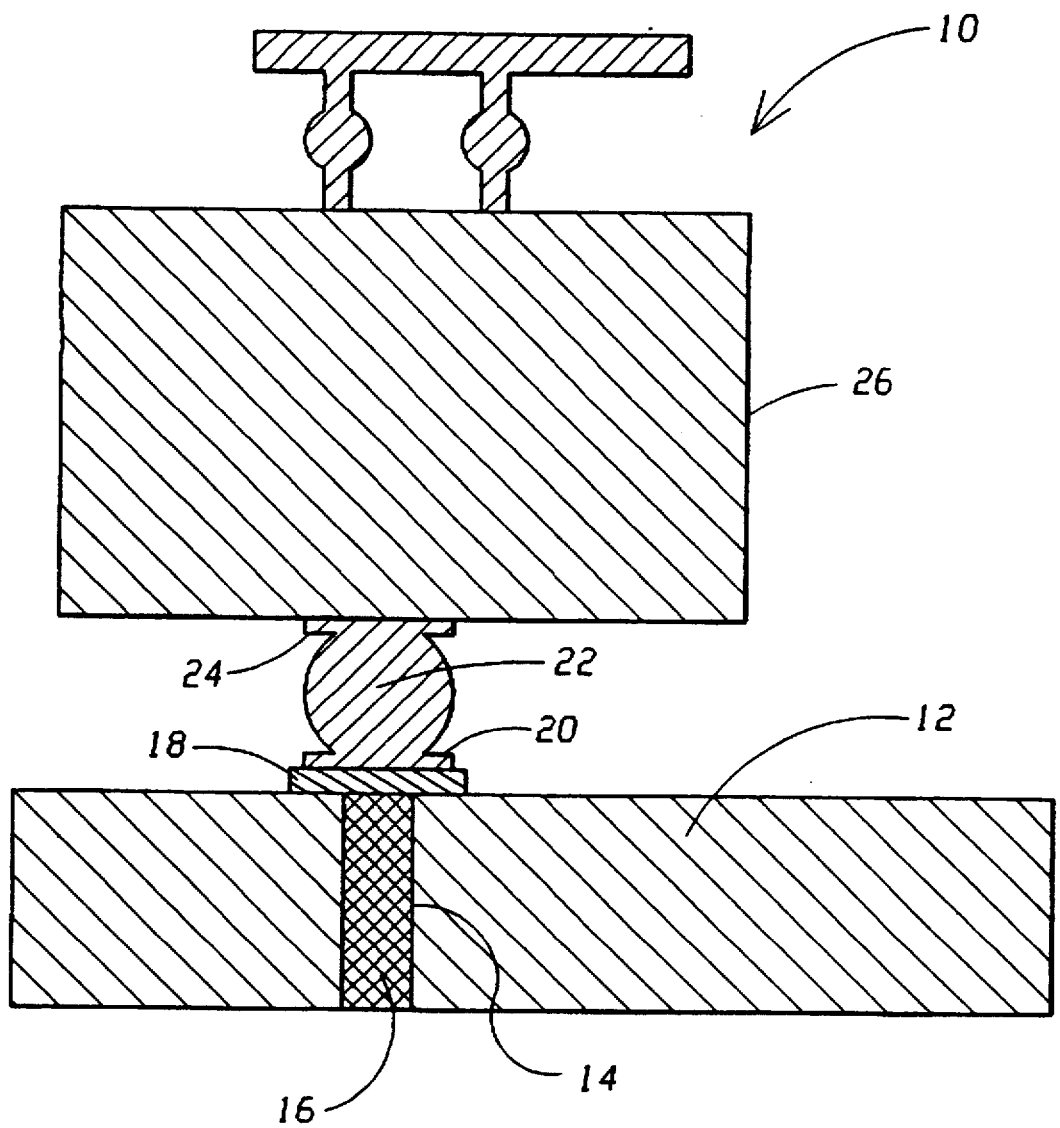
FIG. 1 is a cross-sectional, not to scale view showing a plated through hole, filled with the epoxy composition of the present invention which ends of the filled through hole are covered with a layer of copper. Disposed on the copper layer is a solder ball.
Figure 2:
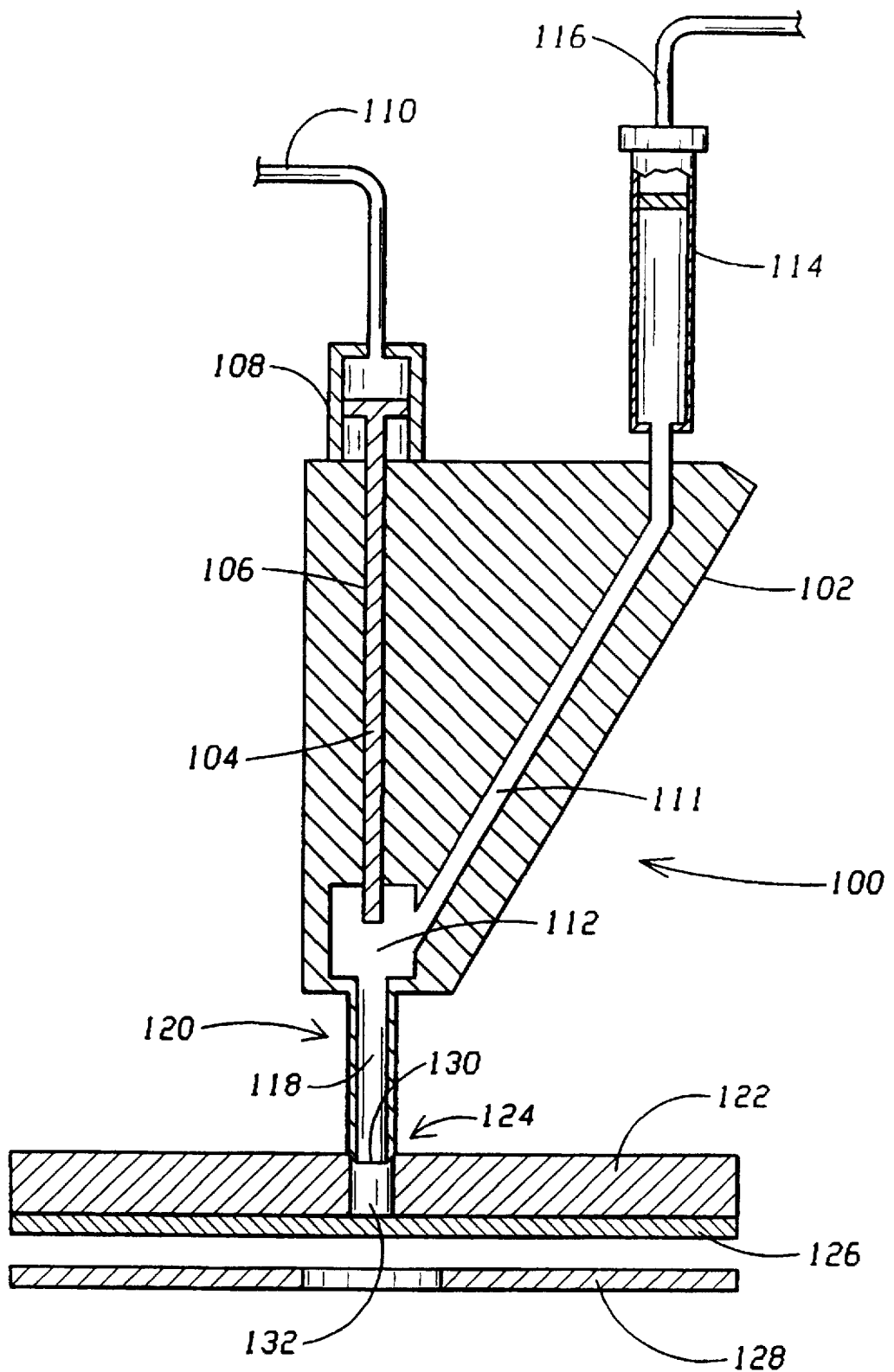
FIG. 2 is a diagrammatic representation of the positive displacement pump system used in the injection method.

Shown in FIG. 1, is a substrate 12, having a through hole 14 filled with fill composition 16. Disposed atop of the filled through hole 14 is pad 18 atop of which is low melting point solder 20. On top of solder 20 is solder ball 22 which has disposed on top solder 24. Chip carrier 26, which is shown with a chip attached, is disposed atop of solder 24.

The preferred printed circuit board includes conventional FR-4 Epoxy and laminates based on high temperature resins such as high temperature epoxies, polyimides, cyanates (triazines), fluoropolymers, ceramic filled fluoropolymers, benzocyclobutenes, perfluorobutanes, polyphenylenesulfide, polysulfones, polyetherimides, polyetherketones, polyphenylquinoxalines, polybenzoxazoles, and polyphenyl benzobisthiazoles, combinations thereof and the like.

THE FILL COMPOSITION

The fill composition contains an electrically conductive powder, a catalyst and a binder; specifically the binder composition is either an epoxy composition or a cyanate composition. The epoxy composition is comprised of epoxy resin, curing agent, conductive powder and catalyst. The epoxy resin is either a cycloaliphatic epoxy resin or an epoxy cresol novolac resin. Depending on the epoxy resin used additional components are also employed. The fill compositions may be used to fill apertures including, for example, vias, through holes, including plated through holes and non-plated through holes. Depending on the desired use of the aperture, the fill composition can be electrically conductive or electrically insulating. Certain fill compositions are used to form resistors having a controlled selected electrical resistance within apertures.

The Conductive Powder

The conductive powder contains electrically conductive powder, including carbon powders and metal powders, such as copper, silver, nickel, molybdenum, gold, palladium, platinum, aluminum powder and mixtures thereof, having an average particle size of 0.1 to 75 microns, preferably 0.5 microns to 25 microns, more preferably about 0.5 to about 10 microns. Suitable copper powders are commercially available from Alcan Powders & Pigments or Metz Metallurgical Corporation. Optionally, electrically insulating powders such as aluminum oxide, 92% alumina, 96% alumina, aluminum nitride, silicon nitride, silicon carbide, beryllium oxide, boron nitride and diamond powder either high pressure or Plasma CVD may be added to the conductive powder. The thermal conductivity of the thermally conductive powder is preferably from about 0.8 to about 1.4 W/m.K.

The amount of electrically conductive powder is added either to provide a fill composition having controlled resistivity to form a resistor, or to provide a fill composition that forms an electrical conductor.

The epoxy compositions of the present invention contain about 5 to about 65% preferably about 8 to about 40% of the combined binder and conductive powder weight, of the binder, and correspondingly about 35 to about 95%, preferably about 60% to about 92% of the combined binder and conductive powder weight, of the thermally conductive powder. As used herein "binder" means the nonmetal and nonsolvent components of the fill composition.

THE EPOXY FILL COMPOSITION

The Cycloaliphatic Epoxy Fill Composition Embodiment

The cycloaliphatic epoxy composition comprises: about 35 to about 95%, preferably about 60 to about 92% conductive powder based on combined binder and conductive powder weight; and about 5 to about 65%, preferably about 8 to about 40% binder, based on combined binder and conductive powder weight. The binder comprises: about 25 to about 75%, preferably about 30 to about 60% by weight cycloaliphatic epoxy resin; about 25 to about 75%, preferably about 30 to about 40%, by weight of anhydride curing agent; catalyst, in an amount sufficient to catalyze the curing of the cycloaliphatic epoxy resin, preferably about 0.05% to about 10%, more preferably about 1% to about 5%, by weight; and optionally, about 0% to about 25%, preferably about 5% to about 20% of the binder weight, of a flexibilizer.

Since the cycloaliphatic epoxy composition does not require a solvent, significant time is saved in processing by not having to dry the cycloaliphatic epoxy composition. The cycloaliphatic epoxy compositions of the present invention are free, or substantially free, that is less than 0.2% by weight, of non-reactive organic solvents.

The preferred cycloaliphatic epoxy resins are non-glycidyl ether epoxides containing more than one 1,2 epoxy group per molecule. These are generally prepared by epoxidizing unsaturated aromatic hydrocarbon compounds, such as cyclo-olefins, using hydrogen peroxide or peracids such as peracetic acid and perbenzoic acid. The organic peracids are generally prepared by reacting hydrogen peroxide with either carboxylic acids, acid chlorides, or ketones to give the compound R—COOOH. These materials are well known, and their synthesis and description may be found in Byrdson, J., *Plastic Materials*, (1966), p. 471. Such non-glycidyl ether cycloaliphatic epoxy resins have a ring structure wherein the epoxide group is part of the ring or is attached to the ring structure. These epoxy resins may also contain ester linkages. Suitable nonglycidyl ether cycloaliphatic epoxy resins have the following structures:

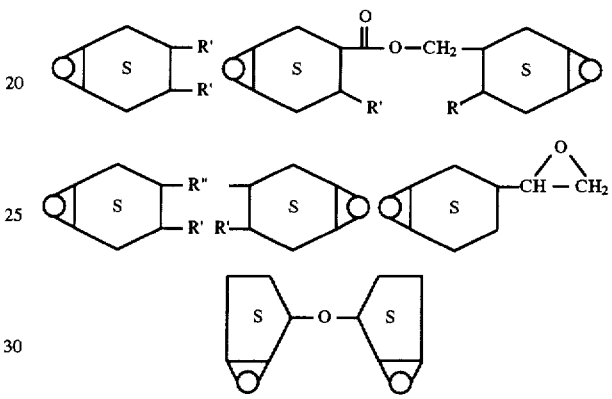

wherein:

S is a saturated ring structure,

R' selected from the group of $CHOCH_2$, $O(CH_2)_nCHOCH_2$ and $OC(CH_3)_2CHOCH_2$ radicals;

R" is selected from the group of $CH_2OOC$, and $CH_2OOC(CH_2)_4COO$ radicals.

Examples of suitable non-glycidyl ether cycloaliphatic epoxides include 3,4-epoxycyclohexylmethyl-3,4-epoxycyclohexane carboxylate; vinylcyclohexane dioxide which contains two epoxide groups, one of which is part of a ring structure; 3,4-epoxy-6-methylcyclohexylmethyl-3,4-epoxycyclohexane carboxylate and dicyclopentadiene dioxide.

Other cycloaliphatic epoxy resins are suitable, including glycidyl ethers such as: 1,2-bis(2,3-epoxycyclopentyloxy)-ethane; 2,3-epoxycyclopentyl glycidyl ether; diglycidyl cyclohexane-1,2-dicarboxylate; 3,4-epoxycyclohexyl glycidyl ether; bis-(2,3-epoxycyclopentyl) ether; bis-(3,4-epoxycyclohexyl) ether; 5(6)-glycidyl-2(1,2-epoxyethyl) bicyclo[2.2.1]heptane; cyclohexa-1,3-diene dioxide or 3,4-epoxy-6-methylcyclohexylmethyl 3",4"-epoxy-6'-methylcyclohexanecarboxylate.

Also suitable are epoxy resins in which the 1,2-epoxy groups are attached to various heteroatoms or functional groups; such compounds include, for example, the N,N,O-triglycidyl derivative of 4-aminophenol, the N,N,O-triglycidyl derivative of 3-aminophenol, the glycidyl ether/ glycidyl ester of salicylic acid, N-glycicyl-N'-(2-glycidyloxypropyl)-5,5-dimethylhydantoin or 2-glycidyloxy-1,3-bis-(5,5-dimethyl-1-glycidylhydantoin-3-yl)propane. Mixtures of cycloaliphatic epoxy resins are also suitable.

The preferred cycloaliphatic epoxy resins include 3,4-epoxycyclohexylmethyl-3-4-epoxycyclohexanecarboxylate, (systematic name: 7-oxabicyclo(4.10)heptane-3-carboxylic acid 7-oxabicyclo(4.1)hept-3-ylmethyl ester) commercially available under the designation ERL-4221 from Union Carbide Company and 3,4-epoxycyclohexylmethyl-3-4-epoxycyclohexane carboxylate mixed with bis(3,4-epoxycyclohexyl) adipate, available under the designation ERL-4299 from Union Carbide Company.

The cycloaliphatic epoxy resins have a preferred epoxy equivalent weight from about 50 to about 500, preferably from about 50 to about 250. The cycloaliphatic epoxy resins have a viscosity less than about 1000 cps at 25° C., preferably about 5 to about 900 cps, more preferably about 300 to about 600 centipoise and most preferably about 300 to about 450 centipoise. The cycloaliphatic epoxy resins have a molecular weight of from about 200 to about 800, more preferably from about 200 to about 700, most preferably about 200 to about 500 and a weight per epoxide of about 50 to about 500, preferably about 50 to about 300. The glass transition temperature of the fill composition is above 130° C., preferably above 140° C. Accordingly, epoxy resins including the cycloaliphatic epoxy resin and mixtures thereof, are selected so as to provide the epoxy composition with a glass transition temperature above 130° C.

The Curing Agent

The curing agents used to cure the cycloaliphatic epoxy resin are anhydrides derived from a carboxylic acid which possesses at least one anhydride group. The carboxylic acids used in the formation of the anhydrides may be saturated, unsaturated, aliphatic, cycloaliphatic, aromatic or heterocyclic. Examples of these anhydrides include, among others, phthalic anhydride, isophtalic anhydride, dihydrophthalic anhydride, tetrahydrophthalic anhydride and hexahydrophthalic anhydride, 1,3,5,6,7,7-hexachloro-3,6-endomethylene 1,2,3,6 tetrahydrophthalic anhydride (chlorendic anhydride), succinic anhydride, maleic anhydride, chlorosuccinic anhydride, monochloromaleic anhydride, 6-ethyl-4-cyclohexadiene, 1,2-dicarboxylic acid anhydride, 3,6-dimethyl-4-cyclohexadiene-1,2-dicarboxylic acid anhydride, 6-butyl-3,5-cyclohexanediene-1,2-dicarboxylic acid anhydride, octadecylsuccinic acid anhydride, dodecylsuccinic acid anhydride, dioctyl succinic anhydride, nonadecadienylsuccinic anhydride, 3-methoxy-1,2,3,6-tetrahydrophthalic acid anhydride, 3-butoxy-1,2,3,6-tetrahydrophthalic anhydride, pyromellitic anhydride, di, tetra, and hexahydropyromellitic anhydride, polyadipic acid anhydride, polysebasic anhydride, and the like and mixtures thereof. Preferred anhydrides include: aromatic monoanhydrides; aromatic dianhydrides, such as pyromellitic anhydride; aliphatic monoanhydrides; cycloaliphatic monoanhydrides; and the chlorinated derivatives thereof. Especially preferred are the normally liquid or low melting anhydrides.

Other suitable curing agents include the trimellitic anhydride, benzophenone tetracarboxylic dianhydrides, polyfunctional cyclic anhydrides including pyromellitic tetracarboxylic acid dianhydride, cyclopentane tetracarboxylic acid dianhydride, diphenylether tetracarboxylic acid dianhydride, the hexacarboxylic acid trianhydride of benzene, cyclohexane. Other suitable curing agents include linear or cyclic anhydrides of any of the following acids: oxalic acid, malonic, glutaric, adipic, pimelic, azelaic, sebacic, brassidic, trimellitic, dimer fatty acid and the polyester acid, such as the diacid from an excess of azelaic acid, and neopentyl glycol sold under the tradename "Emery Diacid", by Emery Chemical Company and having an equivalent weight of 500.

The anhydride curing agent is generally employed in amounts constituting on an equivalent basis, about 20% to about 120%, preferably about 80 to 110% of the cycloaliphatic epoxy resin and preferably about 75% to about 100% of the epoxide equivalents.

The Catalyst

A catalyst is added in an effective amount to promote the crosslinking of the epoxy resin. Suitable catalysts for the epoxy resins include, for example, amines such as the tertiary amines and acidic catalysts such as stannous octoate, and imidazoles. Suitable tertiary amine catalysts include N,N-dimethylbenzylamine, triethylamine, N,N-dimethylaniline, N-methylmorpholine, N-ethylmorpholine, imidazole and tetrachloromethyl ethylene amine, tetramethyl guanidine, triisopropylamine, pyridine, piperrazine, triethyamine, tributylamine, dimethyl benzylamine, triphenyl amine, tricyclohexylamine, quinoline, triethylamines, triphenylamine, tri(2,3-dimethyl cyclohexyl)amine, benzyldimethylamine, 1,3-tetramethyl butane diamine, tris (dimethylaminomethyl) phenol, and triethylenediamine. Suitable imidazoles have one or more alkyl of 1 to 6 carbon atoms or aryl which can be positioned on the amino nitrogen or heterocyclic carbons.

Suitable imidazoles include, for example imidazole, 2-methylimidazole, 2-ethylimidazole, 2-propylimidazole, 2-butylimidazole, 2-pentylimidazole, 2-hexylimidazole, 2-cyclohexylimidazole, 2-phenylimidazole, 2-nonylimidazole, 2-undecylimidazole, 2-heptadecylimidazole, 2-ethyl-4-methylimidazole, 2-phenyl-4-methylimidazole, 1-benzylimidazole, 1-ethyl-2-methylbenzimidazole, 2-methyl 5,6-benzimidazole, 1 vinylimidazole, 1-allyl-2-methylimidazole, 2-cyanoimidazole, 2-cyanoimidazole, 2-chloroimidazole, 2-bromoimidazole, and combinations thereof. Other imidazoles containing oxygen, sulfur or halogen or the like substituents include for example, 1-(2-hydroxypropyl)-2-methylimidazole, 2-phenyl-4,5-dimethylolimidazole, 2-phenyl-4-methyl-5-hydroxymethylimidazole, 2-chloromethylbenzimidazole, 2-hydroxybenzimidazole, and any combination thereof. Most particularly suitable are 2-methylimidazole, 2-ethyl-methylimidazole, 1,2-dimethylimidazole and 2-phenylimidazole, 2-phenyl-4,5-dihydroxymethylimidazole, 2-phenyl-4-methylimidazole, 1-cyanaoethyl-2-methylimidazole, 1-cyanoethyl-2-phenylimidazole, 3,4-dialkyl imidazoles are preferred since they provide accelerated and advanced cure of the epoxy reaction at moderate temperature and provide cured materials with the highest heat distortion temperatures.

Other suitable catalysts are the fully substituted compounds including: quaternary ammonium hydroxides and halides; quaternary phosphonium halides; arsines, amine oxides; aminophenols; phosphine oxides; phosphines; phosphonium halides; amines; phosphoramides; phosphineamines; and tertiary aminophenols. Mixtures of catalyst are also suitable.

The Novolac Epoxy Fill Composition Embodiment

The novolac epoxy fill composition comprises: about 60% to about 95%, preferably about 70% to about 92% conductive powder based on combined binder and conductive powder weight; about 5 to about 40%, preferably about 8 to about 30% binder, based on combined binder and conductive powder weight; and solvent. The solvent is present from about 10% to about 60%, preferably about 20% to about 50%, more preferably about 20% to 30% of the combined binder, conductive powder and solvent weight. The binder comprises: about 20% to about 60%, preferably about 25% to about 60% novolac epoxy resin; about 20% to about 60%, preferably about 25% to about 60% curing agent; catalyst, in an amount sufficient to catalyze the curing of the novolac epoxy resin, preferably about 0.05% to about 10%, more preferably about 0.5% to about 3%, by weight; and optionally, 0% to about 30%, preferably about 5% to about 20% of the binder weight, of a flexiblizer. These amounts are based upon the total amounts of binder and conductive powder in the composition. The novolac epoxy resins have weight per epoxide of about 200 to about 500.

Suitable novolac epoxy resins are commercially available and include novolac epoxy resins obtained by reacting, preferably in the presence of basic catalyst such as sodium hydroxide, an epihalohydrin such as epichlorohydrin with a novolac resin. Novolac resins are the resinous condensate of an aldehyde such as formaldehyde, and either a monohydric phenol, dihydric or a polyhydric phenol. The dihydric phenols include phenols substituted with one or more groups selected from: hydrogen, bromine and chlorine and wherein the aromatic rings are joined by: an alkylene (e.g. methylene) or alkylidene (e.g. isopropylidene) group having from about 1 to about 4 carbon atoms, S, S—S, SO, $SO_2$, CO, or O.

Suitable novolacs are derived from the following phenols: phenol, cresol, alpha and beta-naphthol, o-, m-, or p-chlorophenol, alkylated derivatives of phenol, including for example, o-methyl-phenol, 3,5-dimethylphenol, p-t-butyl-phenol and p-nonylphenol and other monohydric phenols, as well as polyhydric phenols, such as resorcinol and hydroquinone. The polyhydric phenols having from 2 to 6 hydroxyl groups and having from 6 to about 30 carbon atoms are particularly useful in the reaction with epoxy resins to form either linear or crosslinked high molecular weight resins. Novolacs derived from polyhydric phenols include for example, phenol which contain substituted groups including halogen (fluoro, chloro or bromo or hydrocarbyl and the aromatic rings are joined by a group selected from: oxygen, sulfur, SO, $SO_2$, bivalent hydrocarbon radicals containing up to 10 carbon atoms, and oxygen, sulfur and nitrogen containing hydrocarbon radicals, such as: OR'O, OR'OR'O, SR'S, SR'SR'S, OSiO, OSiOSiO, OCOR'COO, COOR'COO, SOR'SO and $SO_2R'SO_2$ radicals wherein R' is a bivalent hydrocarbon radical.

An illustrative, but by no means exhaustive listing of suitable dihydric phenols includes 4,4'-dihydroxydiphenylmethylmethane, (Bis-phenol A), 2,4'-dihydroxydiphenylmethylmethane, 3,3'-dihydroxydiphenyldiethylmethane, 3,4'-dihydroxydiphenylmethylpropylmethane, 2,3'-dihydroxydiphenylethylphenylmethane, 4,4'-dihydroxydiphenylpropylphenylmethane, 4,4'-dihydroxydiphenylbutylphenylmethane, 2,2'-dihydroxydiphenylditolylmethane, 4,4'-dihydroxydiphenyltolylmethylmethane, and the like. 4,4'-isopropylidenediphenol (bisphenol A) is the preferred phenol. Suitable epoxidized novolac resins include, for example, the diglycidyl ethers of resorcinol, catechol, hydroquinone, bisphenol, bisphenol A, bisphenol K, tetrabromobisphenol A, phenol-aldehyde novolac resins, alkyl substituted phenol-aldehyde novolac resins, alkyl substituted phenol-formaldehyde resins, phenol-hydroxybenzaldehyde resins, cresol-hydroxybenzaldehyde resins, dicyclopentadiene-phenol resins, dicyclopentadiene-substituted phenol resins, bisphenol F, tetramethylbiphenol, tetramethyltetrabrobiphenol, tetramethyltribromobiphenol, tetrachlorobisphenol A, and combinations thereof.

Also suitable epoxidized novolac resins include the glycidyl ethers of compounds having an average of more than one aliphatic hydroxyl per molecule such as for example, aliphatic diols, polyether diols, polyether tetraols, and combinations thereof. Also suitable are the alkylene oxide adducts of compounds containing an average of more than one aromatic hydroxyl group per molecule such as, for example, the ethylene oxide, propylene oxide, or butylene oxide adducts of dihydroxy phenols, biphenols, bisphenols, halogenated bisphenols, alkylated bisphenols, trisphenols, phenol-aldehyde novolac resins, halogenated phenol-aldehyde novolac resins, alkylated phenol-aldehyde novolac resins, hydrocarbon-phenol resins, hydrocarbon-halogenated phenol resins, or hydrocarbon-alkylated resins, or any combination thereof.

A suitable novolac epoxy resin is available under the trade designation 8212 from Ciba-Geigy. The 8212 resin is a tetrabromo bisphenol A cured novolac resin catalyzed with methyl imidazole. The 8212 resin also contains the solvent methyl ethyl ketone. The bromine content is about 29%. The precise chemical composition of the 8212 is proprietary. The 8212 resin has a weight per epoxide of about 230 to about 400, 70% solids, and a final glass transition temperature of about 165° C. to about 175° C. Other novolac epoxy resins have such or similar properties would also be suitable. The 8212 resin contains an epoxy cresol novolak resin designated "ECN 1280" commercially available from Ciba Geigy. The ECN 1280 resin which has an epoxide equivalent weight of about 235, and a melting point of about 80° C., sold by Ciba Geigy, is also suitable. Another suitable resin, having similar properties to the ECN 1280 resin, is available under the trade designation "ECN 1299" from Ciba Geigy.

Curing agents

Suitable curing agents for the epoxy novolac resin include conventional phenol-novolac curing agents for a phenol-novolac resin, cresol-novolac resin, and alkyl modified phenol resin, a bisphenol A-novolac resin and a multifunctional phenol resin such as tris(hydroxyphenyl)methane. However, the curing agent should not be restricted to these curing agents. The usage is not restricted to the use of a single curing agent, and two or more curing agents can be used in combination. The preferred curing agent is tetrabromo Bisphenol A.

Suitable curing agents aromatic hydroxyl containing compounds which can be employed herein include, for example compounds having an average of more than one phenolic hydroxyl group per molecule. Suitable such compounds include, for example, dihydroxy phenols, biphenols, bisphenols, halogenated bisphenols, alkylated bisphenols, trisphenols, phenol-aldehyde novolac resins, alkylated phenol-aldehyde novolac resins, phenol-hydroxy benzaldehyde resins, alkylated phenol-hydroxybenzaldehyde resins, hydrocarbon-phenol resins, hydrocarbon-halogenated phenol resins, hydrocarbon alkylated phenol resins, and any combination thereof. Particularly suitable aromatic hydroxyl containing compounds include for example those represented by the formulae:

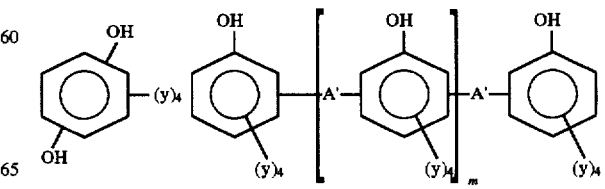

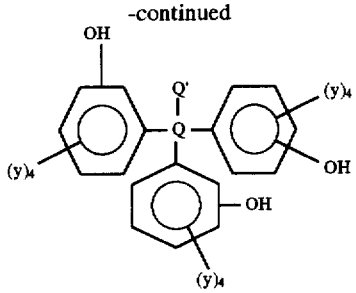

wherein:

- each A' is independently a divalent hydrocarbyl group having from 1 to about 9, preferably from 1 to about 4 carbon atoms or —O—, —SO$_2$—, or —CO—;
- Q is a hydrocarbyl group having from 1 to about 10 carbon atoms;
- Q' is hydrogen or an alkyl group having from 1 to about 4 carbon atoms;
- Y is independently hydrogen, bromine, chlorine, or a hydrocarbyl group having from 1 to about 9, preferably from 1 to about 4 carbon atoms; m has a value from about 0.01 to about 10, preferably from about 0.1 to about 8, more preferably from about 0.5 to about 6.

The term hydrocarbyl means any aliphatic, cycloaliphatic, aromatic, or aryl substituted aliphatic or cycloaliphatic groups or aliphatic or cycloaliphatic substituted aromatic groups. The aliphatic groups can be saturated or unsaturated. Likewise the term hydrocarbyloxy means a hydrocarbyl group having an oxygen linkage between it and the carbon atom to which it is attached. The preferred curing agent is tetrabromo bisphenol A.

The solvent

In the epoxy novolak composition, a solvent is employed to provide suitable viscosity for screening and coating. Suitable solvents include, for example, ketones, such as acetone or methyl ethyl ketone. Methyl ethyl ketone is preferred.

Other epoxy resins

Other epoxy resins may be added to the fill composition. Suitable resins include, the diglycidyl ethers of resorcinol, catechol, hydroquinone, biphenol, bisphenol A, bisphenol K, tetrabromobisphenol A. Suitable resins include a diglycidyl ether of Bisphenol A, having an epoxy equivalent weight of about 185 to about 195 with a viscosity of about 12000 cps., commercially available as Epon 828 from Shell Chemical.

Optional Ingredients to the Epoxy Fill Compositions

The Flexibilizer

Optionally although preferably, a reactive modifier, also known as a "flexibilizer" is added to the cycloaliphatic epoxy composition to impart flexibility and thermal shock resistance to the cured cycloaliphatic epoxy composition. Examples of suitable flexibilizers include: fatty acids; fatty acid anhydrides such as polyazelaic polyanhydride and dodecenylsuccinic anhydride; diols such as ethylene glycol, polyols, polyetherdiols such as polymers of ethylene glycol polyethylene glycol and polypropylene glycol, and other materials having hydroxyl groups, carboxyl epoxy, and/or carboxylic anhydride functionality. Other suitable flexibilizers include trihydric and dihydric carboxyl-terminated, carboxylic anhydride-terminated, glycidyl-terminated and hydroxyl-terminated polypropylene glycols or polybutylene glycols.

Optionally, flexibilizers are also added to impart flexibility and crack resistance to the epoxy novolak fill composition. Suitable flexibilizers include modified hydroxy terminated silicones having the general formulae:

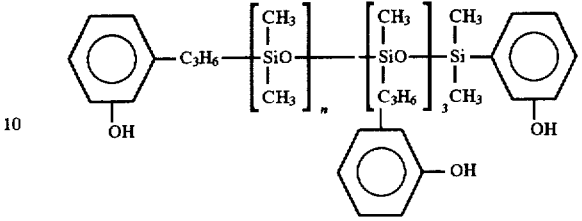

where n is an integer from 10 to 300.

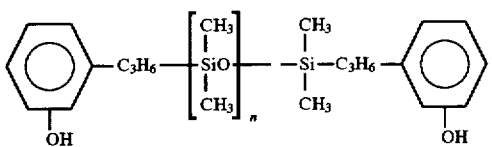

Elastomeric carboxyl-terminated hydroxyl-terminated, mercapto-terminated or glycidyl ether-terminated copolymers based on butadiene, and polar, ethylenically unsaturated comonomers are also suitable flexibilizers. The number average molecular weight of the flexibilizer is between 500 and 6,000, preferably between 1,000 and 2,500. Suitable flexibilizers include polycaprolactone polyol based prepolymer having an average molecular weight of about 1200, commercially available as Tone 0231 from Union Carbide, and an epoxidized butadiene prepolymer, having an average molecular weight of about 1200 to 1300, commercially available as Poly Bd 605 from Elf Atochem North America Inc.

Surfactants

Optionally, surface active agents, referred to herein as "surfactants", are added to the epoxy composition to facilitate mixing the thermally conductive powder with the epoxy resin. When used, the surfactants are present in amounts of about 0.5% to about 3% and preferably about 1.2% to about 1.6% of the combined weight of the binder and the thermally conductive powder. Suitable surfactants include non-ionic type surface active agents, such as Triton X-100 from Rohm and Haas Co. Suitable non-ionic surface active agents include for example, surfactants prepared by the reaction of octylphenol or nonylphenol with ethylene oxide.

The epoxy composition may optionally contain other curing promoters or accelerators and various other materials such as plasticizers, elastomers, fillers, pigments, and surface treating agents.

Optionally, surface treating agents added to the epoxy composition include for example, vinyltrimethoxysilane, vinyltriethoxysilane, N(2-aminoethyl) 3-aminopropylmethyldimethoxysilane, 3-aminopropylethoxysilane, 3-glycidoxypropyl trimethoxysilane, 3-glycidoxypropylmethyl dimethoxysilane, and mixtures thereof. The amount of the surface treating agent used is preferably from 1 to 10 parts, more preferably from 1 to 5 parts, with respect to 100 parts of epoxy resin. Surf ace treating agent is used to provide moisture resistance and improved adhesion.

Cyanate Fill Composition

The cyanate fill composition comprises: from about 5% to about 65%, preferably about 8% to about 40% of a binder; and about 35% to about 95%, preferably about 60 to about 92% of the total fill composition weight of conductive powder. The binder comprises: catalyst in an amount sufficient to catalyze the curing of the resin, preferably about 0.05% to about 5%, more preferably about 0.1% to about 2% of the total binder weight; and resin from about 95% to about 99.95%, more preferably about 98% to about 99.9% of the total binder weight. The resin in the cyanate ester fill composition comprises cyanate ester resin and optionally may contain other epoxy resins including, for example, cycloaliphatic epoxy resin, novolak resin, diglycidyl ether of bisphenol A, or mixtures thereof.

The cyanate ester resins have two or more (—O—C≡N groups and are curable through cyclotrimerization. The cyanate ester resins can be monomeric or less preferably polymeric, including oligomers. The cyanate ester resins contain the following group:

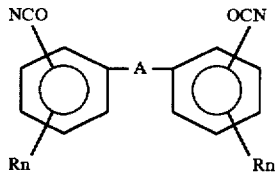

wherein

A is a single bond or selected from: $C(CH_3)(H)$; $SO_2$; O; $C(CF_2)_2$; $CH_2OCH_2$; S; $C(=O)$; $OC(=O)$; $S(=O)$; $OP(=O)O$; $OP(=O)(=O)O$; divalent alkylene radicals such as $CH_2$ and $C(CH_3)_2$; divalent alkylene radicals interrupted by heteroatoms in the chain such as O, S, and N;

R is selected from the group of hydrogen, halogen and alkyl groups containing 1 to 9 carbon atoms;

n is an integer from 0 to 4.

Suitable cyanate ester include difunctional, polyfunctional and polyaromatic cyanate esters.

Suitable polyfunctional cyanates prepared by well known methods, for example, by reacting the corresponding polyvalent phenol with a halogenated cyanate in the presence of a tertiary amine such as triethyl amine as exemplified in U.S. Pat. Nos. 3,553,244, 3,740,348 and 3,755,402.

The phenol reactant can be any aromatic compound containing one or more reactive hydroxyl groups. The phenolic reactant is preferably a di- or tri-polyhydroxy compound of the formula:

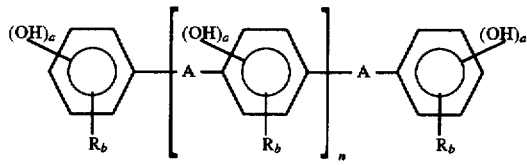

in which each a and b is independently 0, 1, 2, or 3, and at least one a is not 0; n is within the range of 0 to about 8, preferably 0 to 3; each R is independently selected from non-interfering alkyl, aryl, alkaryl, heteroatomic, heterocyclic, carbonyloxy, carboxy, and the like ring substituents, such as hydrogen, $C_{1-6}$ alkyl, $C_{1-6}$ allyl, $C_{1-6}$ alkoxy, halogen, maleimide, propargyl ether, glycidyl ether, and the like; and A is a polyvalent linking moiety which can be, for example, aromatic, aliphatic, cycloaliphatic, polycyclic, and heteroatomic. Examples of linking moiety A include —O—, —$SO_2$—, —CO—, —OCOO—, —S—, —$C_{1-12}$—, dicyclopentadienyl, aralkyl, aryl, cycloaliphatic, and a direct bond.

Examples of other suitable cyanate ester resins include: 1,3- or 1,4-dicyanatobenzene; 1,3,5-tricyanatobenzene, 1,3-, 1,4-, 1,6-, 1,8-, 2,6-, or 2,7-dicyanatonaphthalene, 1,3,6-tricyanatonoaphthalene; 4,4'-dicyanatobiphenyl, bis(4-cyanatophenyl) methane; 2,2-bis(4-cyanatophenyl) propane, 2,2-bis(3,5-dichloro-4-cyanatophenyl)-propane; bis(4-cyanatophenyl) ether; bis(4-cyanatophenyl)-thioether, bis(4-cyanatophenyl) sulfate; tris(4-cyanatophenyl) phosphite; tris (4-cyanatophenyl) phosphate; bis(3-chloro-4-cyanatophenyl) methane; cyanated novolac derived from novolac, cyanated bisphenol type polycarbonate oligomer derived from bisphenol type polycarbonate oligomer, and mixtures thereof.

A suitable polyaromatic cyanate ester containing cycloaliphatic bridging group between aromatic rings is available from Dow Chemical Company under the designation "Dow XU-71787 cyanate". Preferred polyfunctional cyanate ester are: bisphenol AD dicyanate (4,4'-ethylidene bisphenol dicyanate) commercially available as AroCy-L10 from Ciba-Geigy; hexafluoro-bisphenol A dicyanate commercially available as AroCy-F40S from Ciba-Geigy and bisphenol M dicyanate commercially available as RTX-366 from Ciba-Geigy. The bisphenol M dicyanate has the structure:

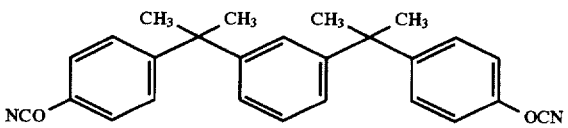

Other suitable cyanate ester resins include the following commercial products having a dielectric constant of 2.6 to 3.1, a homopolymer having a glass transition temperature (Tg) of about from 250° to 290° C., available from Ciba-Geigy: REX-378, REX-379, bisphenol A dicyanates available under the designations AroCy B-10, B-30, B-40S and B-50; tetramethylbisphenol F dicyanates available under the designations AroCy M-10, M-20, M-30, M-40S and M-50; and hexafluorobisphenol A dicyantes, available under the designations AroCy F-40S and F-10. As with the other resins of the fill compositions, the preceding resins are used with varying degrees of polymerization; for example the designation 10 indicates the cyanate ester is a monomer, the designation 30 indicates that the cyanate resin is a semisolid resin, the designation 40S indicates that the cyanate resin is a prepolymer solution and the designation 50 indicates the cyanate resin is a nonsintering solid resin.

When prepolymers of the dicyanate are employed such typically have conversions of up to about 40% and more typically of up to about 30%. If no solvent is used, then, as with the cycloaliphatic resins discussed above, preferably the cyanate ester resin should be liquid so as to permit application. Also, it is preferred that the cyanate ester resin contain no more than 40% trimerized cyanate ester resin.

Suitable catalysts for the cyanate ester resin include Lewis acids, such as aluminum chloride, boron trifluoride, ferric chloride, titanium chloride, and zinc chloride; salts of weak acids, such as sodium acetate, sodium cyanide, sodium cyanate, potassium thiocyanate, sodium bicarbonate, and sodium boronate. Preferred catalysts are metal carboxylates and metal chelates, such as cobalt, iron, zinc, and copper acetylacetonate or octoates or naphthenates.

Solvents

Optionally solvent may be added to the cyanate fill composition. Suitable solvents include ketones, such as for example, acetone and methyl ethyl ketone. Solvents are added from 0% to about 40%, preferably about 15% to about 25% of the total binder and conductive powder weight.

Method for Filling Apertures
Injection Method

The injection method uses an injection apparatus 100, and is the preferred method of filling through holes or vias with the fill compositions free of solvent, such as the cycloaliphatic epoxy fill composition and the liquid cyanate fill composition.

The injection apparatus 100 includes a positive displacement pump 102, which comprises a piston 104 within tube 106. Air cylinder 108, which is connected to air supply 110, is connected to and powers the piston 104. Pump 102 also contains tube 111 which is connected to fill chamber 112 and fill composition reservoir 114. Air supply 116 is also connected to fill composition reservoir 114. Tube 106 and tube 111 converge at chamber 112, which opens to tube 118 located within tip 120. Tip 120 typically has an internal diameter of 0.008 inches and is tapered to allow sealing of the tip to the aperture. Fill composition from reservoir 114 is forced down tube 111 into chamber 112 where piston 104 forces the paste through tube 118 and out opening 130 in metered amounts.

The injection apparatus 100 is mounted on a computer controlled X-Y table of conventional design (not shown) which is capable of reading X-Y data for aperture locations. Suitable dispensing equipment of the type described above is available from Nova/ECD under the designation model 800 or Creative Automation under the designation model 18-12. The fill composition is forced under pressure directly into the via without the use of a mask. The positive displacement pump 102 forces the fill composition through the dispensing tip 130, which is in direct contact with the rim of the via. The end of the tip is tapered to allow sealing of the tip to the via. This is required to displace the air in the via during filling. The fill compositions are applied by dispensing through tips under pressure of about 15 psi to about 90 psi, preferably about 40 psi, and temperatures of about 25° C. to about 40° C., preferably about 30° C. Positioned below, and in direct contact with, substrate 122, is a gas porous sheet 126, such as filter paper, which allows the air to pass through the pores of the paper while the surface of the paper restrains the fill composition within aperture 132 in the substrate 122. The sheet 126 is supported by a template 128 which matches the pattern, of either just the aperture 132 or the substrate 122, thus allowing the air displaced from the aperture 132 to dissipate. The use of a positive displacement pump allows for precise metering of the fill composition so that the apertures are filled to the correct level. As a result, this minimizes the need for further mechanical processing to obtain a uniform surface.

The fill compositions are then cured by heating from about 130° C. to about 200° C., and preferably from about 150° C. to about 190° C., for about 2 hours to about 4 hours, and preferably about 2 hours to about 3 hours. This method of filling the apertures is suitable for a wide range of circuit panel thicknesses from 10–250 mils and tolerates a wide range of hole diameters from 4–25 mils. Since this process does not require the use of a mask, the costs and time associated with the mask, including building, cleaning, aligning and handling are eliminated. Fill composition waste is minimized because only the required amount is dispensed; indeed individual apertures can be selected for filling. This method, unlike screening, insures complete filling of the apertures, and since the vias and through holes are precisely filled, the method leaves no nubs which need to be removed.

Sacrificial Carrier Method

The sacrificial carrier method is the preferred method for filling through holes and vias with fill compositions that contain solvent such as the novolak resin compositions and cyanate compositions.

Shown in FIG. 3 is a sacrificial carrier 150 coated with fill composition 152 disposed on mask 154 which in turn is positioned on substrate 156 containing apertures 158. Sacrificial carrier 150, of a conventional material such as copper foil or polyamide, is coated with a defined thickness which is determined by the length of the aperture to be filled, typically 1–10 mils of fill composition 152. Suitable methods of coating the fill composition 152 onto the sacrificial carrier 150 include for example screening, wire roll coating or other methods known in the art. The composition is partially cured on the carrier 150 at from about 120° C. to about 140° C. preferably at about 130° C. for 3–4 minutes in an oven. Mask 154 containing the drill pattern for the apertures 158 to be filled is aligned on top of the substrate 156. Preferred masks are polyamide films or copper foil. A suitable mask is a film made from biphenyltetracarboxylic dianhydride and p-phenylene diamine, available under the designation Upilex R from UBE Industries, Japan. The coated sacrificial carrier 150 is then placed with the fill composition coating side down, against the mask 154, in a lamination press (not shown). The mask 154 is predrilled with the desired pattern corresponding to the holes to be filled and aligned with substrate 156. The lamination press is then operated to force the fill composition through the mask 154 into the apertures 158 at a pressure and temperature sufficient to allow the fill composition to flow. The coated sacrificial carrier is maintained in the lamination press at the required pressure, e.g. from 100 psi to 350 psi, preferably about 150 psi and temperature from 140° C. to about 200° C., preferably about 185° C. for 60 minutes to 190 minutes preferably 120 minutes to allow the fill composition to cure. After the lamination cycle, the sacrificial carrier 150 and mask 154 are removed, such as by hand peeling from the surface of the substrate 156. Any residual fill composition on the surface of the substrate 156 is removed by conventional mechanical means such as sanding, or chemical means. Vias and through holes having a diameter of 2–25 mils are filled using this method.

Shown in FIG. 4 is a substrate in which the apertures have been filled according to the sacrificial carrier method, after the sacrificial carrier and mask have been removed.

Overplating

After the vias or through holes have been filled, cured and, if necessary, planarized by conventional methods such as sanding, they are preferably over-plated with metal, preferably copper. Where the injection method has been used to fill the vias or through holes, planarization is typically not needed and the filled vias and through holes can be plated directly. Conventional seeding and plating methods such as acid plating or electroless plating can be used. Alternatively, where the fill composition contains metal particles the filled through hole or via can be directly electrolessly plated. In such direct plating, the metal particles in the fill composition act as a seed layer. This method of plating eliminates the need for a seed process. The copper can be plated to any thickness desired, good results have been obtained with thicknesses of, about 100 to about 500 microinches; preferably about 200 to about 300 microinches. Plating durations of about 5 minutes to about 5 hours, preferably 10 minutes to about 60 minutes are suitable. For overplating thicknesses of about 30 to about 130 microinches, suitable conventional electroless baths such as Shipley C3000, from Shipley can be used. For overplating thicknesses greater than about 130 microinches, suitable conventional "full build" electroless baths such as Shipley C3000, can be used.

followed by an acid copper plating bath such as those available from Schering, MacDermid or Shipley.

Overplating can be performed at various stages in production of a substrate. For example, if the through holes and vias are filled before a subtractive circuitization step is done, a seed process, in which a conventional seed layer such as, for example palladium-tin colloid, can be deposited on the surface of the substrate, followed by conventional electrolytic or electroless copper plating, and conventional subtractive etching of circuitry.

Alternatively, where fine line subtractive circuitization is desired, the circuit lines may be etched immediately after hole fill and planarization has been completed. Conventional subtractive circuitization processes are used to define fine line structures in the thin, laminated copper foil. Conventional electroless copper overplating is performed after a solder mask coating has been applied to the card. Plating will not occur in areas covered by the solder mask, and thus only the filled hole ends and other exposed copper surfaces will be plated.

Conventional fully additive circuits may also be fabricated on substrates having filled holes. After hole fill and planarization, the laminated copper foil is etched from the surface, a conventional seed layer is applied, followed by a patterned photoresist and electroless copper plating of circuit lines to the desired thickness.

Alternatively, where extremely fine grid via densities are desired, for example pad-on-pad interposer cards or direct chip attach structures, the following process sequence that only plates the filled hole ends is employed. Following hole fill and planarization, as required, the substrate is etched to remove the surface metal. The substrate is then electrolessly copper plated without seeding. Plating occurs only on the filled hole ends, wherein the metal particles of the hole fill material provide the seed or catalyst for copper deposition. Thus, plating is precisely limited to the filled hole ends, and results in a structure of raised copper bumps. These copper bumps may then be overplated with conventional interconnect metals, for example nickel-gold or tin-lead, to provide pad-on-pad or direct chip attach sites. Via or interconnect grids of less than 0.010" can be achieved when this technique is used.

The overplating can provide a surface upon which a solder ball is placed. As a result the solder ball is disposed over either a through hole or via, thereby increasing the packaging density.

The filled through holes or vias of examples 1 and 2 were overplated using the metal in the fill composition as a seed layer for overplating. Examples 1, 2, and 5 were overplated by electroless copper plating to about 100–300 microinches.

Resistor Embodiment

While the invention has been described primarily for conductive and or nonconductive through holes and vias, it is also possible to fill the through holes and vias with a fill composition having a pre-determined electrical resistivity to provide a resistor in a via or through hole. The resistor is a component of the circuit and has a predetermined resistance value. Using a through hole or via to contain a resistor reduces the space on the surface of the board that is otherwise occupied by discrete chip or pin in hole type resistors. This method also provides resistors of improved tolerance, reduced cost and improved electrical performance over other fabricated or assembled resistors.

The fill compositions of the present invention, including the epoxy fill compositions and the cyanate fill compositions are tailored to provide the resistor fill composition. The resistor fill composition typically comprises: from about 25% to about 95%, preferably about 35% to about 95%, by total fill composition weight of an electrically conductive powder; and from about 5% to about 75%, preferably from about 5% to about 65%, by total fill composition weight, of binder.

Resistors having other resistance values may be produced by utilizing the known resistance equation:

$$R = Rho\ L/A$$

Where:

R=Resistance Value in ohms

Rho=Material Resistivity in ohm-inches

L=Resistor Length=Board Thickness

A=Cross-sectional Area

Desired resistor values may be produced by varying the board thickness, the drill diameter of the hole to be filled, the resistivity of the resistor fill composition, or combinations thereof. The resistivity of the resistor fill composition can be varied by modifying the percent of the electrically conductive powder, such as copper typically from 0–40%, or carbon typically from 0–90% in the resistor fill composition, or by adding compounds such as TaSi, NiCr, NiP, etc., or mixtures thereof, or by varying the sizes or shapes of the component particles, or by combination of the above. Moreover, to achieve desired resistance values, two different resistor materials may be blended. Resistors are created in through holes by filling the holes with resistor fill composition according to the injection method, the sacrificial carrier method, or conventional methods.

Precision resistors can be achieved using either a laser or abrasive trimming process after the hole is filled and the fill composition is cured, but prior to copper overplating. In a trimming process, the resistor value is first determined by electrically probing the two resistor ends, followed by trimming and re-testing. When the hole is filled using the sacrificial carrier method, the laminated and drilled copper foil on the top and bottom of the board serves as a mask for the laser or abrasive trimming, so the excess resistor fill composition is removed from the hole, but not elsewhere. Such trimming results in a reduction in the resistor length, and thus a reduction in resistance.

The resistor-in-hole process can be used to produce solder ball connections on top or bottom of the plated resistor ends. Filling apertures with the resistor fill composition is generally done prior to through hole plating. Preferably, the resistors in through holes are used for producing large quantities of isolated terminating resistors as are required by emitter coupled logic type applications.

In addition to providing cost reductions, board surface area reductions, reliability enhancements and electrical performance enhancements over conventional discrete resistor assembly technologies, the resistor in a through hole presents other advantages over conventional planar and buried resistor technologies. These advantages include lower production cost, and improved resistor tolerance. This resistor design can also be utilized for high reliability applications where it is desirable to perform a leakage test between adjacent electrical nets, by filling desired holes with resistor fill composition after leakage testing in newly drilled through holes. When performed as a final process, the resistor ends can be capped by either covering the resistor ends with a conductive, solderable epoxy material or plated to provide a pad atop the exposed end of the resistor. Such plating may be by conventional methods or by the overplating methods disclosed herein.

17

EXAMPLES OF FILL COMPOSITION

Example 1

A cycloaliphatic epoxy fill composition was prepared by combining: about 4.25 parts by weight of 3,4-epoxycyclohexylmethyl-3,4-epoxycyclohexane carboxylate designated ERL-4221 from Union Carbide; about 4.31 parts by weight of methyl-hexahydrophthalic anhydride; about 1.12 parts by weight of Tone 0231 from Union Carbide; about 0.326 parts by weight of 2-ethyl-4-methyl imidazole; about 1.17 parts by weight of Poly Bd-605 from Elf Atochem North America Inc., and about 100.86 parts by weight of copper powder from Alcan Powder and Pigments having a particle size less than 10 microns. Vias in cards were filled with this composition using the injection method. The composition was cured at about 140° C. for about 1.5 hours. The filled vias were then overplated according to the following overplating methods. A portion of the vias were overplated by first seeding the surface with Shipley electroless bath followed by conventional acid plating using a Shipley acid copper plating bath. Another portion was overplated by seeding the surface with Pd/Sn colloidal followed by electroless copper plating using shipley C3000. The cards containing the filled vias were evaluated in solder ball connect technology by being run through 2650 cycles ATC testing from 2–80 C.; no failures were noted. In addition three repetitions of solder shock testing revealed no failures. Another portion of the vias were plated using the copper in the fill composition as the seed layer for electroless plating; such overplating method adequately plated the filled vias.

Example 2

A cycloaliphatic epoxy fill composition was prepared by combining: about 4.32 parts by weight of ERL-4221, a 3,4-epoxycyclohexylmethyl-3,4-epoxycyclohexane carboxylate from Union Carbide; about 4.16 parts by weight of hexahydrophthalic anhydride; about 1.08 parts by weight of Tone 0231 from Union Carbide; about 0.052 parts by weight of benzyl dimethyl amine; about 1.06 parts by weight of Poly Bd-605, from Elf Atochem North America Inc., and about 42.36 parts by weight of copper powder from Metz Metallurgical Corporation having a particle size less than 4 microns. Plated through holes were filled with this composition using the injection method. The composition was cured in an oven at about 140°–150° C. for about 2 hours.

Example 3

A cycloaliphatic epoxy fill composition was prepared by combining: about 4.4 parts by weight of ERL-4221, a 3,4-3-epoxycyclohexylmethyl-3,4-epoxycyclohexane carboxylate from Union Carbide, about 4.00 parts by weight of methylhexahydrophthalic anhydride; about 1.15 parts by weight of Tone 0231 from Union Carbide; about 0.072 parts by weight of benzyl dimethyl amine; about 1.20 parts by weight of Poly-Bd 605 from Elf Atochem North America Inc., and about 31.77 parts by weight of copper powder from Alcan Powder and Pigments having a particle size less than 10 microns. Plated through holes were filled with this composition using the injection method, and cured at 140°–160° C. for about 1.5 hours.

Example 4

A cycloaliphatic epoxy fill composition was prepared by combining: about 4.50 parts by weight of ERL-4221, a 3,4-3-epoxycyclohexylmethyl-3,4-epoxycyclohexane carboxylate from Union Carbide; about 4.34 parts by weight of methylhexahydrophthalic anhydride; about 1.08 parts by weight of Tone 0231 from Union Carbide; about 0.11 parts by weight of benzyl dimethyl amine; and about 45.36 parts by weight of Copper powder from Alcan Powder and Pigments having a particle size less than 10 microns. The composition was used in filling plated through holes using the injection method. The composition was then cured at 140°–160° C. for about 2 hours.

Example 5

A novolac epoxy fill composition was prepared by combining: 20.18 parts by weight of an epoxy novolac designated 8212 from Ciba-Geigy and containing about 30% methyl ethyl ketone; about 55.4 parts by weight of copper powder from Alcan Powders and Pigments; 0.18 parts by weight of a surface treating agent, specifically, a silane coupling agent Z-6040 from Dow-Corning and about 0.045 parts by weight 2-ethyl-4-methyl imidazole. About 10 parts by weight of methyl ethyl ketone was added to provide the proper viscosity to coat 1 oz. copper foil for filling the vias according to the sacrificial carrier method. Foils having different coating thickness from 0.002, 0.004, 0.0065 inches were used. Various substrates, such as an FR-4 circuit board with thickness, 0.040, 0.060, 0.100 inches, and various via diameter: 0.004–0.012 (0.002 increments) inches in pattern: 8×1.5 inch (1000 vias) per via size were placed in the lamination press with the mask aligned to the hole pattern in the substrate. The sacrificial carrier was placed with the coated side against the polyamide mask. The entire package was then placed under vacuum for 7 minutes prior to heating. The lamination pressure was maintained at 150 psi with a peak temperature of 185° C. for 2 hours.

All combinations of substrate, via diameter and coating thickness completely filled the vias. Panels having filled vias were overplated by first seeding the surface followed by electroless copper plating using Shipley C3000.

Example 6

A cyanate ester fill composition was prepared by combining: about 7.6 parts by weight of Bisphenol AD dicyanate from Ciba-Geigy Corporation under the designation Arocy L10; about 43.5 parts by weight of copper powder from Alcan Powders and Pigments; and about 0.25 parts by weight of zinc octanoate. Vias were filled using this composition employing the injection method and cured at temperatures of about 200°–220° C. for about 3 hours under nitrogen.

Example 7

A cyanate fill composition was prepared by combining: about 7.6 parts by weight of Arocy L10, a Bisphenol AD dicyanate from Ciba-Geigy Corporation; about 2.5 parts by weight of EPON 828 from Shell Chemical; about 43.5 parts by weight of Copper powder from Alcan Powders and Pigments; and about 0.25 parts by weight of zinc octanoate. Vias were filled with this composition employing the injection method and the composition was then cured at about 180°–190° C. for about 2 hours.

Example 8

A cyanate fill composition was prepared by combining: about 7.6 parts by weight of Arocy L10, a Bisphenol AD dicyanate from Ciba-Geigy Corporation; about 3.5 parts by weight of ECN-1280 a cresol novolak epoxy resin from Ciba-Geigy; about 44.5 parts by weight of copper powder from Alcan Powders and Pigments; and about 0.25 parts by weight of zinc octanoate. Vias were filled with this composition employing the injection method and the composition was cured at about 175°–195° C. for about 2 hours.

Example 9

A cyanate fill composition was prepared by combining: about 7.6 parts by weight of Arocy L10, a Bisphenol AD dicyanate from Ciba-Geigy Corporation, about 2.5 parts of dinonyl phenyl cyanate; about 43.5 parts by weight of copper powder from Alcan Powders and Pigments; and about 0.25 parts by weight of zinc octanoate. Vias were filled with this composition employing the injection method and the composition was cured at about 160°–190° C. for about 2 hours.

Example 10

A cyanate fill composition was prepared by combining: about 8.5 parts by weight of RTX-366, a Bisphenol M dicyanate from Ciba-Geigy, about 1.5 parts by weight of Bisphenol AD dicyanate; about 45.3 parts by weight of copper powder from Alcan Powders and Pigments; about 0.2 parts by weight of zinc octanoate and about 20 parts by weight of methyl ethyl ketone. The composition was coated onto a sacrificial 1 oz copper foil, air dried and partially cross-linked in an oven at 140° C. for 3–4 minutes and evaluated as in Example 5.

Example 11

A cyanate fill composition was prepared by combining: about 8.2 parts by weight of Arocy L10 as Bisphenol AD dicyanate from Ciba-Geigy Corporation; about 2.5 parts by weight of EPON 828 from Shell Chemical; about 45.5 parts by weight of copper powder from Alcan Powders and Pigments; about 0.25 parts by weight of zinc octanoate; and about 30 parts by weight of methyl ethyl ketone. The composition was coated onto a sacrificial 1 oz copper foil, air dried and b-staged at 140° C. for 3–4 minutes and evaluated as in Example 5.

All combinations of substrate, via diameter and coating thickness exhibited complete filling of the vias.

Example 12

An epoxy novolac fill composition was prepared by combining about 30.6 parts by weight of 8212 an epoxy cresol novolac epoxy resin from Ciba-Geigy (in about 30% methyl ethyl ketone); about 63.6 parts by weight of copper powder from Alcan Powders and Pigments, about 0.22 parts by weight of the silane coupling agent Z-6040 from Dow-Corning; about 0.03 parts by weight 2-ethyl-4-methyl imidazole and about 20.5 parts by weight of Vulcan P, a carbon black from Cabot Corporation. About 10 parts by weight of methyl ethyl ketone was added to provide the proper viscosity to coat the 1 oz copper foil for filling the vias according to the sacrificial carrier method. The electrical resistivity of the epoxy composition was 0.128 ohm-inches. Foils having different coating thickness from 2–3 mils were made.

The substrates, such as an FR4 circuit board with thickness, 60 mils, and nonplated vias of diameter: 0.014 mils in pattern: 8×1.5 inch (1000 vias) were placed in the lamination press with the mask aligned to the hole pattern in the substrate. The sacrificial carrier was placed with the coated side against the polyamide mask. The entire package was then placed under vacuum for 7 minutes prior to heating. The lamination pressure was maintained at 150 psi with a peak temperature of 185° C. for 2 hours. All vias were completely filled. Next the board was drilled, seeded with palladium tin colloid, conventionally acid copper plated and circuitized thus leaving each end of the resistor capped with a plated copper. Resistors in holes had an average resistance of 50 ohms.

Example 13

An epoxy novolac fill composition was prepared by combining 20.6 parts by weight of 8212 from Ciba-Geigy in about 30% methyl ethyl ketone; about 37.5 parts by weight of Black Pearls 2000, a carbon powder from Cabot Corporation; about 0.2 parts by weight of silane coupling agent Z-6040 from Dow-Corning; and about 0.045 parts by weight 2-ethyl-4-methyl imidazole. About 10 parts by weight of methyl ethyl ketone was added to provide the proper viscosity to coat the 1 oz copper foil for filling the vias according to the sacrificial carrier method. Foils having different coating thickness from 2–3 mils were made. The foils were laminated with an FR4 circuit board as described in Example 12.

Example 14

A cycloaliphatic epoxy fill composition was prepared by combining: about 4.4 parts by weight of ERL-4221, a 3,4-epoxycyclohexylmethyl-3,4-epoxycyclohexane carboxylate from Union Carbide; about 4.0 parts by weight of methylhexahydrophthalic anhydride; about 1.11 parts by weight of Tone 0231 from Union Carbide; about 0.296 parts by weight of 2-ethyl-4-methyl imidazole; about 0.9 parts by weight of Poly Bd-605, a flexiblizer, from Elf Atochem North America, Inc.; about 43.86 parts by weight of copper powder from Alcan Powder and Pigments having a particle size less than 10 microns; and about 11 parts by weight of Vulcan XC72, a carbon black from Cabot Corporation. The preceding materials were combined using a low shear mixer, degassed in a vacuum desiccator and placed in a freezer for testing. Subsequently, this composition was used in filling the vias using the injection method and cured at about 140° C. for about 2 hours.

Example 15

A cyanate ester fill composition was prepared by combining: about 6 parts by weight of Arocy L10, a Bisphenol AD dicyanate from Ciba-Geigy Corporation; about 4.5 parts by weight of EPON 828 from Shell Chemical; about 30.5 parts by weight of copper powder from Alcan Powders and Pigments; about 6 parts by weight of Vulcan P, a carbon black from Cabot Corporation; and about 0.10 parts by weight of zinc octanoate. Vias were subsequently filled using this composition employing the injection method and cured at about 180° C. for about 1.5 hours.

Example 16

A cyanate fill composition was prepared by combining about 6 parts by weight of RTX-366, a Bisphenol M dicyanate from Ciba-Geigy Corporation; about 6 parts by weight of Arocy L10, a Bisphenol AD dicyanate from Ciba-Geigy Corporation; about 4.3 parts by weight of copper powder from Alcan Powders and Pigments; about 9 parts by weight of Vulcan XC72, a carbon black from Cabot Corporation; and about 0.15 parts by weight of zinc octanoate. Vias were subsequently filled using this composition employing the injection method and cured at about 185° C. for about 2 hours.

The above examples 2–16 all filled the vias completely.

While the invention herein has often been described as relating to the attachment of solder ball connect modules, it is also applicable for attachment of other surface devices such as conventional surface mount component leads or direct chip attach C-4 solder joints.

What we claim is:

1. A method of forming a resistor in a circuit carrier comprising the steps of:
   a. providing a circuit carrier having at least one aperture;
   b. filling the aperture with a resistor fill composition to provide a resistor with exposed ends;
   c. measuring the resistance of the resistor; and
   d. trimming the resistor to provide a desired resistance values;
   e. selective overplating the exposed ends of the resistor to provide a pad over the aperture.

2. The method of claim 1, wherein the fill composition comprises metal and in step e, the metal is used as a seed layer to overplate the filled aperture.

3. A method of forming a resistor having a resistance value, in a circuit carrier, comprising the steps of:
   a. providing a circuit carrier having at least one aperture of known dimensions or volume;
   b. calculating a material resistivity value required to produce the resistance value according to the formula:

$$Rho = R < L/A$$

Where:
   R=Resistance Value in ohms
   Rho=Material Resistivity in ohm-inches
   L=Resistor Length=Board Thickness
   A=Cross-sectional Area c. providing a fill composition of the material resistivity value calculated in step b; and
   d. filling the aperture with the resistor fill composition;
   e. selectively overplating the exposed ends of the resistor to provide a pad over the aperture.

* * * * *

UNITED STATES PATENT AND TRADEMARK OFFICE
CERTIFICATE OF CORRECTION

PATENT NO. : 5,766,670
DATED : June 16, 1998
INVENTOR(S) : Arldt, et al.

It is certified that error appears in the above-identified patent and that said Letters Patent is hereby corrected as shown below:

Claim 3, col. 22, line 10 SHOULD READ:

$$Rho = R \ / \ \frac{L}{A}$$

Signed and Sealed this

Thirteenth Day of October 1998

*Attest:*

*Attesting Officer*

BRUCE LEHMAN
*Commissioner of Patents and Trademarks*

UNITED STATES PATENT AND TRADEMARK OFFICE
CERTIFICATE OF CORRECTION

PATENT NO. : 5,766,670
DATED      : June 16, 1998
INVENTOR(S) : Arldt, et al.

It is certified that error appears in the above-identified patent and that said Letters Patent is hereby corrected as shown below:

On the title page, item [73]

Assignee: International Business Machines Corporation
          Old Orchard Road
          Armonk, New York Signed and Sealed this Twenty-first Day of December, 1999

Attest:

Q. TODD DICKINSON

*Attesting Officer*     *Acting Commissioner of Patents and Trademarks*